US012615952B2

(12) United States Patent
Fang et al.

(10) Patent No.: US 12,615,952 B2
(45) Date of Patent: Apr. 28, 2026

(54) METHOD FOR MANUFACTURING DISPLAY PANEL INCLUDING A HOLE

(71) Applicant: KunShan Go-Visionox Opto-Electronics Co., Ltd, Kunshan (CN)

(72) Inventors: Xuyang Fang, Kunshan (CN); Gongzheng Zang, Kunshan (CN); Shizhen Feng, Kunshan (CN); Mingxing Liu, Kunshan (CN); Shuaiyan Gan, Kunshan (CN); Gang Wang, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 388 days.

(21) Appl. No.: 18/360,225

(22) Filed: Jul. 27, 2023

(65) Prior Publication Data

US 2023/0371355 A1    Nov. 16, 2023

Related U.S. Application Data

(63) Continuation of application No. PCT/CN2021/138194, filed on Dec. 15, 2021.

(30) Foreign Application Priority Data

Mar. 26, 2021    (CN) .......................... 202110328551.0

(51) Int. Cl.
*H10K 71/40* (2023.01)
*H10K 59/12* (2023.01)
*H10K 71/16* (2023.01)

(52) U.S. Cl.
CPC ......... *H10K 71/40* (2023.02); *H10K 59/1201* (2023.02); *H10K 71/166* (2023.02)

(58) Field of Classification Search
None
See application file for complete search history.

(56) References Cited

U.S. PATENT DOCUMENTS

2016/0313480 A1* 10/2016 Lee ........................ B32B 27/40

FOREIGN PATENT DOCUMENTS

CN        103311460 A   *  9/2013
CN        104779200 A      7/2015
(Continued)

OTHER PUBLICATIONS

International Search Report issued Feb. 24, 2022, in corresponding International Application No. PCT/CN2021/138194, partial English translation is included, 7 pages.
(Continued)

*Primary Examiner* — Sue A Purvis
*Assistant Examiner* — Seyon Ali-Simah Punchbeddell
(74) *Attorney, Agent, or Firm* — Maier & Maier, PLLC

(57) ABSTRACT

A method for manufacturing a display panel including a display area, a hole area and a transition area between the display area and the hole area. The method includes: providing a semi-finished product of the display panel, including a substrate and a partition ring disposed around the hole area; forming a desorption layer on the surface of the substrate and in the hole area; forming a luminescent structure layer in the display area and the transition area on the side of the substrate, and a luminescent structure layer on the surface of the desorption layer away from the substrate and in the hole area, a portion of the luminescent structure layer in the transition area being partitioned by the partition ring; sublimating the material of the desorption layer to remove a portion of the luminescent structure layer in the hole area.

20 Claims, 5 Drawing Sheets

(56)         References Cited

FOREIGN PATENT DOCUMENTS

| CN | 109244039 | A | * | 1/2019 | ......... H10D 86/0212 |
|----|-----------|---|---|--------|------------------------|
| CN | 109461839 | A | * | 3/2019 | ............ H10K 71/00 |
| CN | 109935730 | A |   | 6/2019 | |
| CN | 109994657 | A |   | 7/2019 | |
| CN | 110112182 | A |   | 8/2019 | |
| CN | 110416282 | A |   | 11/2019 | |
| CN | 110459700 | A | * | 11/2019 | ............ H10K 71/00 |
| CN | 110854304 | A |   | 2/2020 | |
| CN | 110867526 | A |   | 3/2020 | |
| CN | 110993835 | A |   | 4/2020 | |
| CN | 111180496 | A |   | 5/2020 | |
| CN | 111653605 | A |   | 9/2020 | |
| CN | 111933825 | A |   | 11/2020 | |
| CN | 111968517 | A |   | 11/2020 | |
| CN | 113078197 | A |   | 7/2021 | |
| WO | 2019240438 | A1 |  | 12/2019 | |

OTHER PUBLICATIONS

Office Action issued Mar. 29, 2022, in corresponding Chinese Application No. 202110328551.0, 33 pages.
Rejection Decision issue Jun. 9, 2022, in corresponding Chinese Application No. 202110328551.0, partial English translation is included, 10 pages.

* cited by examiner

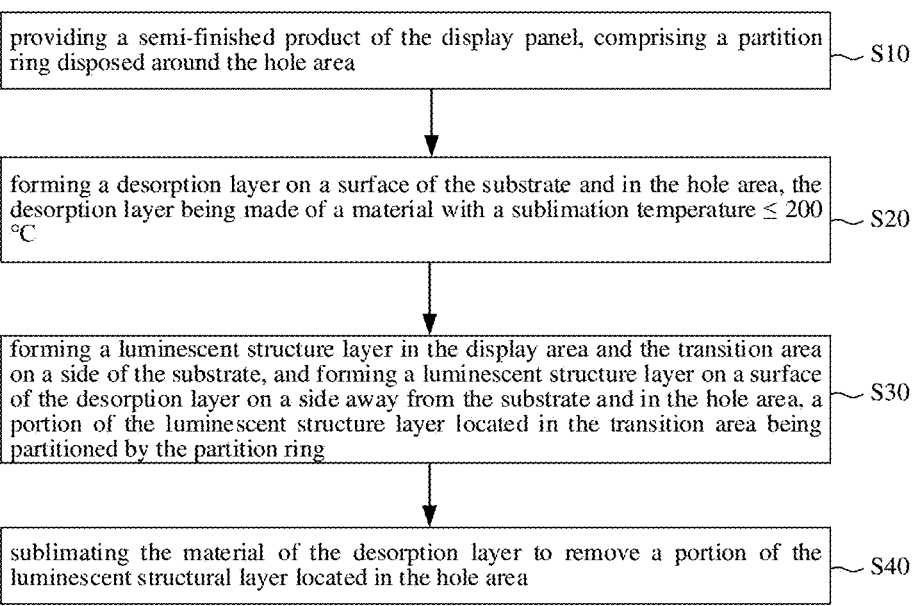

| | |
|---|---|
| providing a semi-finished product of the display panel, comprising a partition ring disposed around the hole area | S10 |
| forming a desorption layer on a surface of the substrate and in the hole area, the desorption layer being made of a material with a sublimation temperature ≤ 200 °C | S20 |
| forming a luminescent structure layer in the display area and the transition area on a side of the substrate, and forming a luminescent structure layer on a surface of the desorption layer on a side away from the substrate and in the hole area, a portion of the luminescent structure layer located in the transition area being partitioned by the partition ring | S30 |
| sublimating the material of the desorption layer to remove a portion of the luminescent structural layer located in the hole area | S40 |

Fig. 1

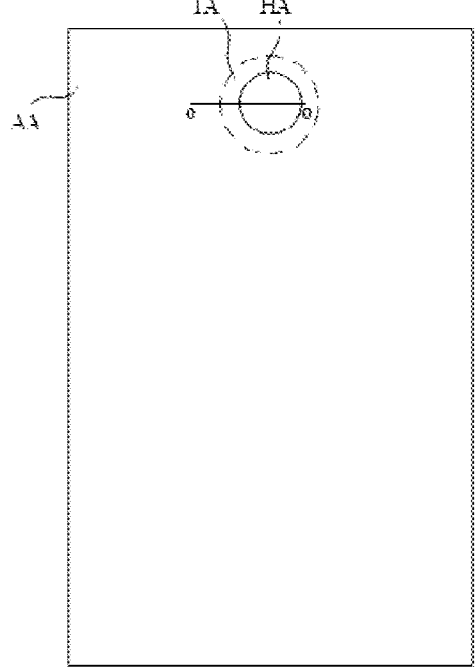

Fig. 2

METHOD FOR MANUFACTURING DISPLAY PANEL INCLUDING A HOLE

CROSS-REFERENCE OF RELATED APPLICATIONS

The present application is a continuation of International Application No. PCT/CN2021/138194, filed on Dec. 15, 2021, which claims priority to Chinese Patent Application No. 202110328551.0 filed on Mar. 26, 2021, both of which are hereby incorporated by reference in their entireties.

FIELD

The present application relates to the technical field of display technology, specifically a method for manufacturing a display panel.

BACKGROUND

With the rapid development of electronic devices, users have put forward higher requirements for screen-to-body ratio. The blind hole screen that integrates front facing cameras, earphones, or infrared sensing components etc. below the screen has received attention from display panel developers due to its ability to achieve higher screen-to-body ratio.

However, due to the limitations of existing hole opening processes, it is difficult to use a mask to block the blind hole area in the evaporation process of organic luminescent film layers. Therefore, the film layer in the blind hole area is usually cut and removed after the process of the organic luminescent film layer. However, the great difficulty and high cost of cutting the organic luminescent film layers in blind hole area are not conducive to the commercial promotion and application of the blind hole screen.

SUMMARY

In order to solve the above technical problem, the embodiments of the present application provide a method for manufacturing a display panel, which has a simple and low-cost solution for removing the luminescent structure layer in the hole area, and can improve the transmittance of the hole area.

The present application provides a method for manufacturing a display panel, which includes a display area, a hole area, and a transition area between the display area and the hole area. The method comprises steps of:

providing a semi-finished product of the display panel, the semi-finished product includes a substrate and a partition ring disposed on a side of the substrate and located in the transition area, the partition ring being disposed around the hole area;

forming a desorption layer on a surface of the substrate and in the hole area, the desorption layer being made of a material with a sublimation temperature ≤200° C.;

forming a luminescent structure layer on a side of the substrate and in the display area and the transition area, and form a luminescent structure layer on a surface of the desorption layer on a side away from the substrate and in the hole area, a portion of the luminescent structure layer located in the transition area being partitioned by the partition ring;

sublimating the material of the desorption layer to remove a portion of the luminescent structure layer located in the hole area.

According to the method for manufacturing the display panel provided in the embodiment of the present application, the portion of the luminescent structure layer located in the hole area is separated from the desorption layer formed by the sublimable material on the substrate, and due to the disposing of the partition ring, the portion of the luminescent structure layer located in the hole area can be disconnected from the portion located in the display area; Afterwards, the material of the desorption layer is sublimated, and the portion of the luminescent structure layer located in the hole area can be easily peeled off and removed. According to the embodiment of the present application, the solution for removing the luminescent structure layer in the hole area is simple and low cost. By avoiding the influence of the luminescent structure layer in the hole area on the light transmittance, the transmittance of the hole area can be improved.

BRIEF DESCRIPTION OF THE DRAWINGS

By reading the detailed description of non-limiting embodiments with reference to the accompanying drawings, the other features, objectives, and advantages of the present application will become more apparent. In the figures, the same or similar reference signs represent the same or similar features, and the figures are not drawn to the actual scale.

FIG. 1 is a flowchart of a method for manufacturing a display panel according to the embodiment of the present application.

FIG. 2 is a schematic plan of the display panel in the method for manufacturing a display panel according to the embodiment of the present application.

DETAILED DESCRIPTION

The following will provide a detailed description of the features and exemplary embodiments of various aspects of the present application. In order to make the purpose, technical solution, and advantages of the present application clearer, the following will provide a further detailed description of the present application in conjunction with the accompanying drawings and specific embodiments. It should be understood that the specific embodiments described here are only configured to explain the present application and are not configured to limit the present application. For the skilled person in the art, the present application can be implemented without the need for some of these specific details. The description of the embodiments below is only intended to provide a better understanding of the present application by showing examples of the present application.

The display panel is the key structure for the display device to achieve display functions. By designing openings in the display area, it is convenient to integrate functional devices such as cameras, earphones, and infrared sensors, which helps to narrow the border and achieve high screen-to-body ratio. The solutions using the blind hole integrate functional devices such as cameras, earphones, and infrared sensors below the screen, which is beneficial for further reducing the area of the opening area and thereby increases the screen-to-body ratio further.

In the display panel of blind hole type, the film layer in the hole area can cause low transmittance of the incident light in the hole area, so it is necessary to remove the film layer in the hole area. In order to provide a simple and effective solution for removing the film layer in the hole area and reduce the cost of manufacturing the display panel, the inventor developed a method for manufacturing a display panel that can achieve automatic peeling and falling-off of the film layer in the hole area.

FIG. 1 shows a flowchart of the method for manufacturing a display panel according to an embodiment of the present application. Referring to FIG. 1, the method for manufacturing a display panel according to an embodiment of the present application includes a step S10 of providing a semi-finished product of the display panel, a step S20 of forming a desorption layer, a step S30 of forming a luminescent structure layer, and a step S40 of removing a luminescent structure layer in the hole area.

Figure 3:
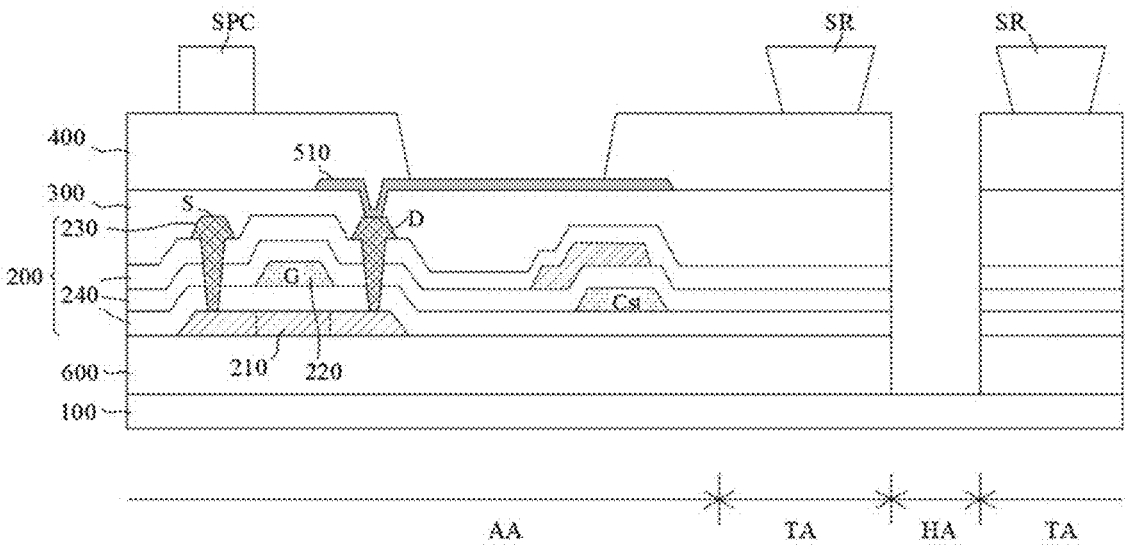
FIG. 3 is a cross-sectional schematic diagram of a partial area of the semi-finished product of the display panel according to the embodiment of the present application.

FIG. 2 shows a schematic plan of a display panel as an example. FIG. 3 is a cross-sectional diagram of a partial area of the semi-finished product of the display panel shown in FIG. 2, where the cross-sectional position of the semi-finished product of the display panel corresponds to the o-o position of the display panel in FIG. 2. Referring to FIG. 2, the display panel includes display area AA and hole area HA. The display area AA is the active area for displaying image information on the display panel. The hole area HA can be limited within the display area AA. In this example, the display area AA completely surrounds the hole area HA. In other examples, the hole area HA can also be located at the edge of the display area AA. For example, the display area AA partially surrounds the hole area HA. There are no special restrictions on the shape of the hole area HA, which can be selected according to actual needs. In some embodiments, the hole area HA may be square, circular, quasi circular, or a combination thereof. There is a transition area TA between the display area AA and the hole area HA.

Referring to FIG. 3, in the step S10 of providing the semi-finished product of the display panel, the semi-finished product of the display panel includes a substrate 100, and a partition ring SR is disposed on a side of the substrate 100. The partition ring SR is located in the transition area TA and is disposed around the hole area HA.

The substrate 100 can be formed using a material known in the art. In some embodiments, the substrate 100 may adopt a rigid substrate, such as a glass substrate, a hard plastic substrate, etc. The substrate 100 may also adopt a flexible substrate, such as a substrate formed by flexible plastics such as polyimide (PI).

The partition ring SR is a closed ring surrounding the hole area HA. The shape of the partition ring SR can be the same as or different from the shape of the hole area HA. In some embodiments, the shape of the partition ring SR is the same as the shape of the hole area HA. The partition ring SR can use metal material such as aluminum, titanium, silver, nickel, copper, etc., non-metallic inorganic material such as silicon oxide, silicon nitride, silicon, indium tin oxide, etc., and organic material such as photoresists.

The partition ring SR can be synchronously formed in the film layer process of the semi-finished product of the display panel to simplify the process. In some embodiments, the partition ring SR and the spacer SPC are formed in the same process. As a specific example, the step S10 of providing the semi-finished product of the display panel includes: sequentially forming a pixel circuit layer 200, a flattening layer 300, a first electrode layer 510, and a pixel defining layer 400 on the surface of the substrate 100, and forming a blind hole extending towards the substrate 100 from the surface of the pixel defining layer 400 away from the substrate 100 in the hole area HA; forming a partition ring SR located in the transition area TA and a spacer SPC located in the display area AA on the surface of the pixel defining layer 400 away from the substrate 100. Under the condition of meeting the light transmittance requirements of the hole area HA, the depth at which the blind hole extends from the surface of the pixel defining layer 400 away from the substrate 100 towards the substrate 100 can be selected according to actual needs. In order to further improve the light transmittance of the hole area HA, a transparent material can be used for the film layer on the surface of the substrate 100 located in the hole area HA. In some embodiments, the blind hole can penetrate the pixel circuit layer 200, flattening layer 300, first electrode layer 510, and pixel defining layer 400 to expose the surface of the substrate 100 located in the hole area HA. This can achieve higher light transmittance in the hole area HA.

The pixel circuit layer 200 includes pixel circuits arranged in an array. The pixel circuit can include a thin film transistor TFT and a storage capacitor Cst. TFT can be either top gate type TFT or bottom gate type TFT.

The pixel circuit layer 200 includes a semiconductor layer 210, a gate layer 220, and a source drain layer 230 that are sequentially stacked, and the semiconductor layer 210, the gate layer 220, and the source drain layer 230 are separated by an insulation layer 240, respectively.

The semiconductor layer 210 includes a source region, a drain region, and a channel region located between the source region and the drain region. Optionally, the semiconductor layer 210 can use more than one of amorphous silicon, monocrystalline silicon, polycrystalline silicon (such as low-temperature polycrystalline silicon LTPS, etc.), and indium gallium zinc oxide. In some embodiments, the material of the semiconductor layer 210 can be deposited to form a film layer; Patterned processing is performed for the film layer to form a patterned film layer, which further has an opening located in the hole area HA; the patterned film layer is dopped to form a semiconductor layer 210 including the source region, the drain region and the channel region. Patterned processing can be performed using a method known in the art, such as dry etching.

The gate layer 220 includes gate G, which corresponds to the channel region of the semiconductor layer 210. Optionally, the gate layer 220 can use more than one of titanium, molybdenum, gold, platinum, aluminum, nickel, and copper. In some embodiments, the material of the gate layer 220 can be deposited to form a film layer; Patterned gate layer 220 is formed by performing patterned processing for the film layer. The patterned gate layer 220 further has an opening located in the hole area HA. Patterned processing can be performed using a method known in the art, such as dry etching or wet etching.

In some embodiments, the gate layer 220 may further optionally include a first electrode for storing the capacitor Cst. The second electrode of the storage capacitor Cst is located on the side of the first electrode away from the substrate 100, and is separated from the first electrode through a capacitive dielectric layer. The second electrode can use more than one of titanium, molybdenum, gold, platinum, aluminum, nickel, or copper.

The source drain layer 230 includes a source S and a drain D. The source S is electrically connected to the source region through a through hole in the insulation layer 240 that passes through the source drain layer 230 and the semiconductor layer 210. The drain D is electrically connected to the drain region through a through hole in the insulation layer 240 that passes through the source drain layer 230 and the semiconductor layer 210. The source drain layer 230 can use a material known in the art, such as titanium, molybdenum, gold, platinum, aluminum, nickel, and copper. As an example, the source drain layer 230 is a composite layer of Ti Al Ti. In some embodiments, the material of the source drain layer 230 can be deposited to form a film layer; Patterned processing is performed for the film layer to form a patterned source drain layer 230. The patterned source drain layer 230 further has an opening located in the hole area HA. Patterned processing can be performed using a method known in the art, such as dry etching or wet etching.

In some embodiments, the insulation layer 240 between adjacent film layers of the semiconductor layer 210, the gate layer 220, and the source drain layer 230 may use a material known in the art, such as more than one of silicon oxide, silicon nitride, and silicon based nitrogen oxide. Furthermore, the insulation layer 240 can also extend to the transition area TA. This can provide support for the subsequent preparation of the partition ring SR. The insulation layer 240 can be formed using a method known in the art. In the process of insulating layer 240, a method known in the art, for example, dry etching or wet etching, can be used so that an opening located in the hole area HA is formed in the insulating layer 240.

In some embodiments, a buffer layer 600 can be formed further between the substrate 100 and the semiconductor layer 210. The buffer layer 600 can be a silicon oxide layer, a silicon nitride layer, or a composite layer of a silicon oxide layer and a silicon nitride layer. Furthermore, the buffer layer 600 can extend to the transition area TA. This can provide support for the subsequent preparation of the partition ring SR. The buffer layer 600 can be formed using a method known in the art. In the process of the buffer layer 600, a method known in the art, for example, dry etching or wet etching, can be used so that an opening located in the hole area HA is formed in the buffer layer 600.

The flattening layer 300 is located on the side of the pixel circuit layer 200 away from the substrate 100. The flattening layer 300 covers the pixel circuit layer 200. Moreover, the flattening layer 300 has through holes to expose the connecting electrode of the pixel circuit layer 200. In some examples, the connecting electrode can be the source S. In another example, the connecting electrode can be drain D.

The flattening layer 300 may use a material known in the art. As an example, the flattening layer 300 may use an organic material, such as one or more selected from polyimide (PI), polyethylene terephthalate (PET), epoxy resin, phenolic resin, and the like. The flattening layer 300 can also use an inorganic material, such as one or more selected from silicon oxides, silicon nitrides, and silicon based nitrogen oxides. The flattening layer 300 can be formed using a method known in the art. In the process of flattening layer 300, a method known in the art, for example, dry etching or wet etching, can be used so that an opening located in the hole area HA is formed in the flattening layer 300.

The first electrode layer 510 includes multiple first electrodes, which can be either the anode or cathode of an OLED. As an example, the first electrode is the anode of OLED. The first electrode can use a material known in the art, for example, silver; for example, the composite layer of indium tin oxide/silver/indium tin oxide. In some embodiments, the material of the first electrode can be deposited to form a film layer; the patterned processing is performed for the film layer to form the patterned first electrode layer 510. The patterned first electrode layer 510 further has an opening located in the hole area HA. Patterned processing can be performed using a method known in the art, such as dry etching or wet etching.

The pixel defining layer 400 is located on the surface of the first electrode layer 510 away from the substrate 100. The pixel defining layer 400 has a pixel opening corresponding to the first electrode, and further has an opening located in the hole area HA. The pixel defining layer 400 may use a material known in the art, for example, more than one of polyimide (PI), polyethylene terephthalate (PET), epoxy resin, phenolic resin, etc. The pixel defining layer 400 can be formed using a method known in the art. In the process of pixel defining layer 400, a method known in the art, for example, dry etching or wet etching, can be used so that to a pixel opening and an opening located in the hole area HA are formed in the pixel defining layer 400.

Next, a support layer is formed on the surface of the pixel defining layer 400 away from the substrate 100; The support layer is patterned to form a spacer SPC and a partition ring SR. The support layer can use a material known in the art, such as negative photoresist. In some embodiments, the support layer uses negative photoresist, and the portion of the support layer located in the transition area TA can be exposed and developed to form a partition ring SR with an inverted trapezoidal or T-shaped cross-sectional structure.

Figure 4:
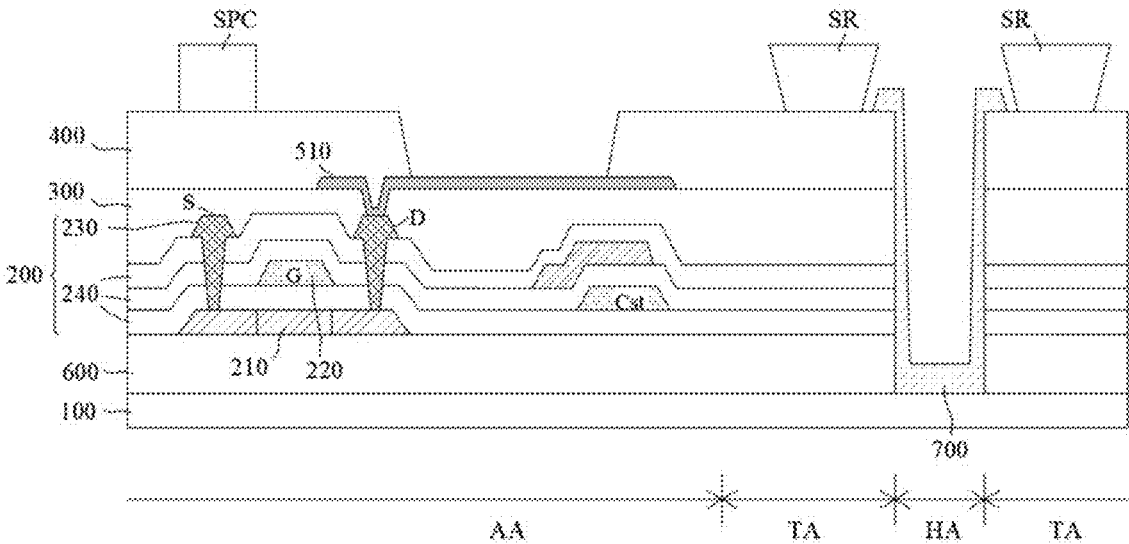
FIG. 4 is a step diagram of forming a detachment layer in the method for manufacturing a display panel according to the embodiment of the present application.

Referring to FIG. 4, in the step S20 of forming the desorption layer, a desorption layer 700 is formed on the surface of the substrate 100 and located in the hole area HA. The desorption layer 700 is made of a material with a sublimation temperature ≤200° C.

In some embodiments, the sublimation temperature of the material of the desorption layer 700 is between 40° C. and 200° C., preferably between 45° C. and 100° C.

As an example of the material of the desorption layer 700, it may include, but is not limited to, one or more of iodine, naphthalene, arsenic trioxide, phosphorus pentachloride, acrylamide, aluminum trichloride, and ferric chloride. In some embodiments, the material of the desorption layer 700 is selected from one or more of iodine and ferric chloride. Preferably, the material of the desorption layer 700 has a high purity, for example, a purity of over 95%, over 97%, over 98%, over 99%, over 99.5%, over 99.9%, or over 99.99%. The material purity of the desorption layer 700 is high, which can reduce the influence of impurities on the luminescent structure layer 520.

The material of the desorption layer 700 can be attached to the hole area HA of the substrate 100 using a method known in the art, for example, physical vapor deposition method, to form the desorption layer 700. In some embodiments, the step S20 may include using a mask to block the display area AA and the transition area TA, evaporating the material of the desorption layer 700 onto the surface of the substrate 100 located in the hole area HA, forming the desorption layer 700. The mask can be supported on the partition ring SR and spacer SPC to block the display area AA and the transition area TA. The edge of the mask surrounding the hole area HA is overlapped on the partition ring SR. If there are multiple partition rings SR, the edges of the mask surrounding the hole area HA can be overlapped on the partition ring SR near the hole area HA. The material of the detachment layer 700 passes through the opening of the mask and is deposited in the area surrounded by the partition ring SR.

In some embodiments, the surface of the partition ring SR away from the substrate 100 is located on the same horizontal plane as the surface of the spacer SPC away from the substrate 100. This can facilitate the partition ring SR and the spacer SPC to support the mask so as to facilitate the operation of the step S20 of forming the desorption layer. Especially, the partition ring SR and the spacer SPC are on the same horizontal plane, which can further improve the support strength of the cover plate in the hole area HA, thereby improving the overall strength of the display panel, while avoiding poor display generated by larger deformation of the cover plate in the hole area HA.

Figure 5:
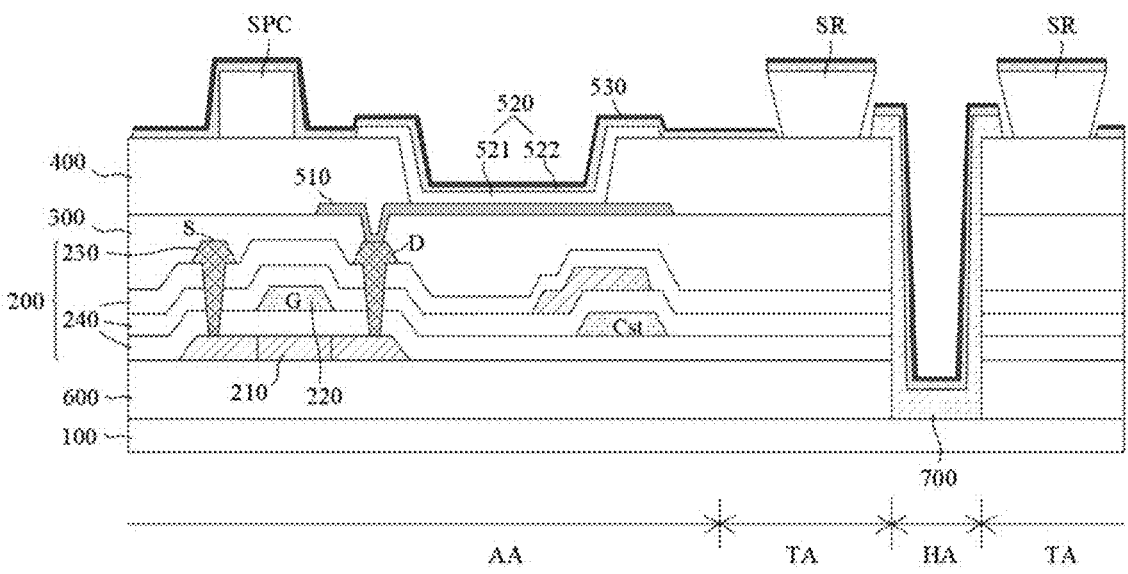
FIG. 5 is a step diagram of forming a luminescent structure layer in the method for manufacturing a display panel according to the embodiment of the present application.

Referring to FIG. 5, in the step S30 of forming a luminescent structure layer, a luminescent structure layer 520 is formed in the display area AA and the transition area TA on a side of the substrate 100, and a luminescent structure layer 520 is formed on the surface of the desorption layer 700 away from the substrate 100 and in the hole area HA. The portion of the luminescent structure layer 520 located in the transition area TA is partitioned by a partition ring SR. Here, the portion of the luminescent structure layer 520 located in the hole area AA and the portion located in the display area AA can be completely or partially disconnected, preferably completely disconnected, in order to more easily remove the portion of the luminescent structure layer 520 located in the hole area AA.

The thickness of the desorption layer 700 can be selected according to actual needs as long as the thickness meets that the substrate 100 is separated from the luminescent structure layer 520. For example, the thickness of the desorption layer 700 can be 20 nm-100 nm, 30 nm-70 nm, 40 nm-60 nm, etc.

The luminescent structure layer 520 includes an organic luminescent layer 521 and a common organic material layer 522 stacked on a side of the first electrode layer 510 away from the substrate 100. The organic luminescent layer 521 can be located on either side of the common organic material layer 522 in the stacking direction, or can be sandwiched between the common organic material layers 522.

The organic light emitting layer 521 is typically located within the pixel opening of the pixel defining layer 400. The organic luminescent layer 521 may include an organic luminescent material known in the art, such as blue luminescent material, red luminescent material, green luminescent material, etc. The organic light emitting layer 521 can be evaporated into a film using a fine mask, thereby conveniently forming independent light emitting units located within each pixel opening.

The common organic material layer 522 can include more than one of electron injection layer (EIL), electron transfer layer (ETL), hole barrier layer (HBL), electron barrier layer (EBL), hole transfer layer (HTL), and hole injection layer (HIL). These film layers can all use relevant material known in the art. The common organic material layer 522 is usually continuously filmed to be shared by multiple light-emitting units. Therefore, the common organic material layer 522 can be evaporated into a film using a universal mask.

As shown in FIG. 5, in the film forming process of the luminescent structure layer 520, the partition ring SR of the transition area TA can effectively partition the film layer located in the hole area HA.

Figure 6:
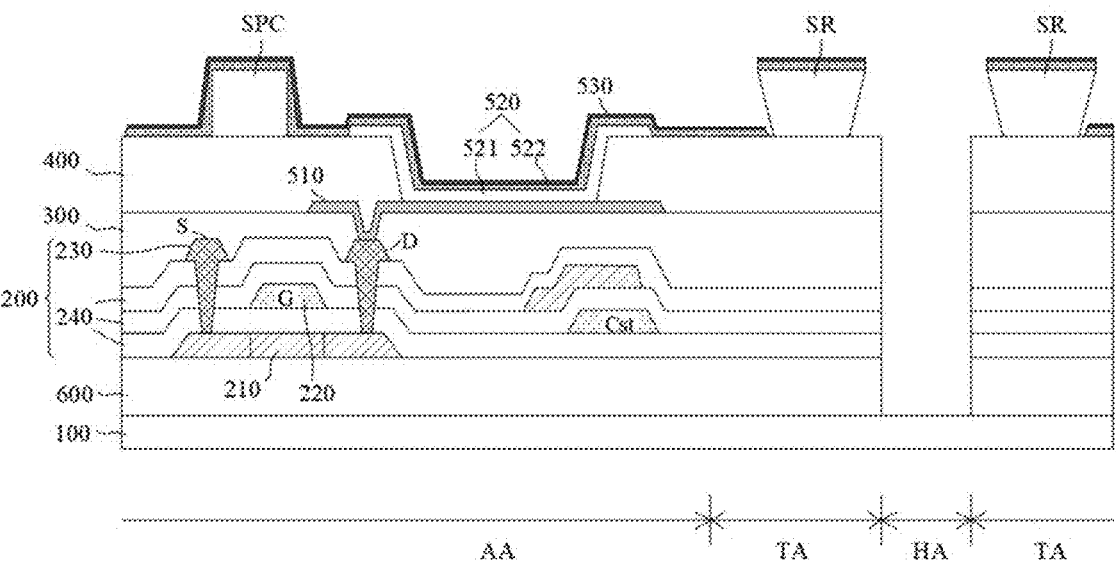
FIG. 6 is a step diagram of removing the portion of the luminescent structure layer located in the hole area in the method for manufacturing a display panel according to the embodiment of the present application.

Referring to FIG. 6, in the step S40 of removing the luminescent structure layer in the hole area, the material of the desorption layer 700 is sublimated, thereby removing the portion of the luminescent structure layer 520 located in the hole area HA. The material of the desorption layer 700 can be sublimated by heating, and the connection between luminescent structure layer 520 and the substrate 100 can be disconnected, thereby facilitating the removal of the portion of the luminescent structure layer 520 located in the hole area HA.

The step S40 can be carried out in a vacuum chamber. As an example, a semi-finished product of the display panel formed with a luminescent structure layer 520 is placed in a vacuum chamber, and the luminescent structure layer 520 of the semi-finished product of the display panel faces downwards; Heating is performed so as to sublimate the material of the desorption layer 700, and the sublimated material is discharged from the chamber along with vacuum pumping. As a result, the portion of the luminescent structure layer 520 located in the hole area HA can automatically peel off and fall off under the action of gravity.

In some embodiments, the cross-section of the partition ring SR in the stacking direction of the film layers of the display panel decreases in a gradient from the edge away from the substrate 100 to the edge near the substrate 100. For example, the cross-section of the partition ring SR is inverted trapezoidal or T-shaped. Such a partition ring SR can partition the connection between the portion of the luminescent structure layer 520 located in the hole area HA and the portion located in the display area AA better, thereby making it more convenient to remove the portion of the luminescent structure layer 520 located in the hole area HA in the step S40 of removing the luminescent structure layer in the hole area.

Figure 7:
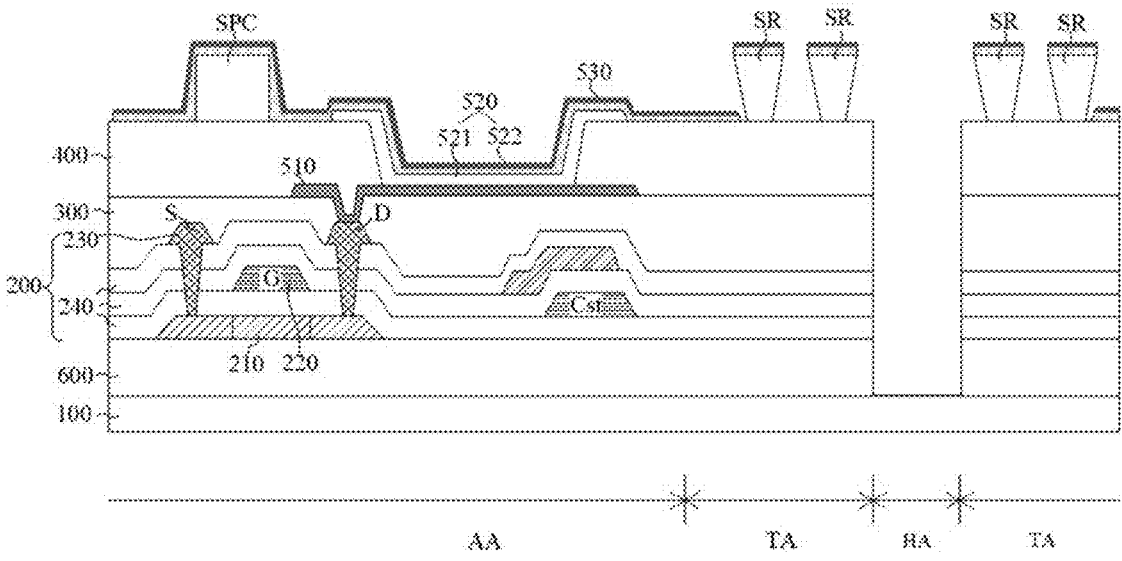
FIG. 7 is a step diagram of removing the portion of the luminescent structure layer located in the hole area in the method for manufacturing a display panel according to another embodiment of the present application.

Referring to FIG. 7, in some embodiments, in the direction from the hole area HA to the display area AA, the transition area TA can be disposed with multiple partition rings SR, with adjacent partition rings SR separated from each other. Multiple partition rings SR can be two or more, such as 2-500, 5-100, 10-400, 50-300, or 100-350, etc. By disposing multiple partition rings SR in the transition zone TA, the luminescent structure layer 520 can be partitioned better, which is beneficial for removing the portion of the luminescent structure layer 520 located in the hole area HA more conveniently in the step S40 of removing the luminescent structure layer in the hole area. In addition, the partition ring SR has a good partition effect on the luminescent structure layer 520, and can further block the invasion paths of water vapor, oxygen, and other substances entering the display area AA through the hole area HA, enhancing the effect of blocking water and oxygen, thereby forming a better encapsulation effect for the hole area HA.

A second electrode layer 530 is further formed on the side of the luminescent structure layer 520 away from the substrate 100. The first electrode layer 510, the luminescent structure layer 520, and the second electrode layer 530 form an OLED luminescent structure. The second electrode layer 530 can be a cathode layer. The second electrode layer 530 can be selected from aluminum (Al), magnesium (Mg), silver (Ag), or alloy thereof.

The second electrode layer 530 can be formed before or after the step S40 of removing the luminescent structure layer in the hole area. In some embodiments, the second electrode layer 530 can be formed before the step S40 of removing the luminescent structure layer in the hole area. This can not only remove the organic luminescent layer in the hole area HA, but also remove the second electrode layer 530 in the hole area HA, simplifying the process. In another embodiment, a second electrode layer 530 can be further formed after the step S40 of removing the luminescent structure layer in the hole area. The second electrode layer 530 in the hole area HA can be removed by etching to improve the transmittance of the hole area HA.

In other embodiments, the partition ring SR can also be formed in the same process as any other film layer of the semi-finished product of the display panel. A method known in the art can be used to obtain the target cross-sectional shape of the partition ring SR. As an example, the isolation ring SR and the source drain layer 230 are formed in the same process. Specific examples may include: the material of the source drain layer 230 is disposed to form a film layer; Patterned processing is performed for the film layer to form a patterned source drain layer 230. The patterned source drain layer 230 has a source S, a drain D, and an annular portion surrounding the hole area HA; Lateral etching is performed on the annular portion to form a partition ring SR with a trapezoidal or T-shaped cross-section. The portion of the film layer formed after the process of the partition ring SR located in the transition area TA can be partitioned by the partition ring SR, and at the same time separated by the desorption layer 700 located in the hole area HA. Therefore, after the material of the desorption layer 700 is sublimated, the portion of the film layer located in the hole area HA can be conveniently removed.

In other embodiments, the partition ring SR can also be formed in a separate process. For example, on the surface of the substrate 100 or any other film layer of the semi-finished product of the display panel, a partition ring SR surrounding the hole area HA is formed using a method known in the art. The portion of the film layer formed after the process of the partition ring SR located in the transition area TA can be partitioned by the partition ring SR, and at the same time separated by the desorption layer 700 located in the hole area HA. Therefore, after the material of the desorption layer 700 is sublimated, the portion of the film layer located in the hole area HA can be conveniently removed.

Figure 8:
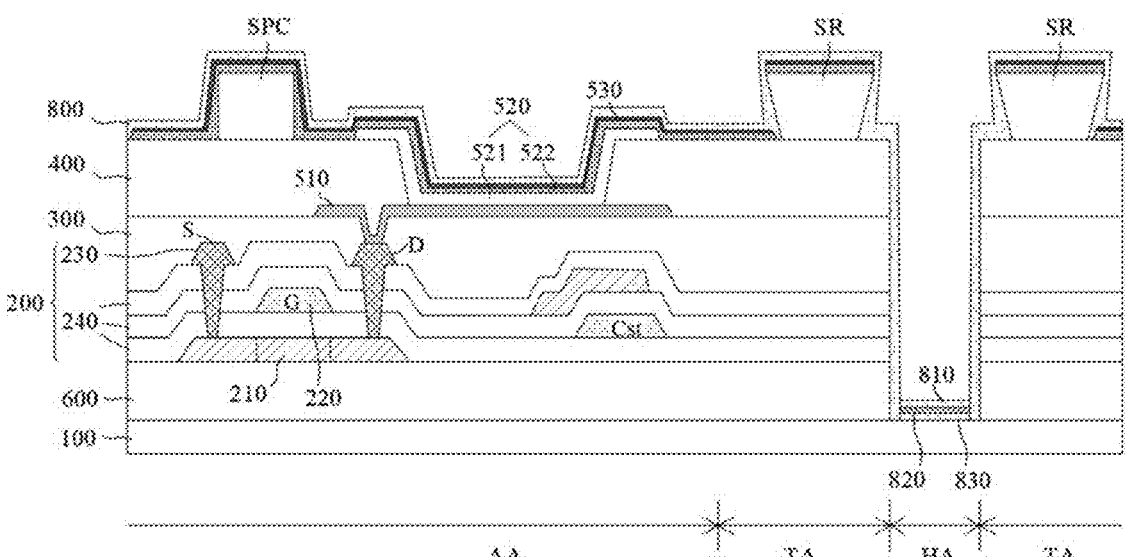
FIG. 8 is a step diagram of forming a packaging layer in the method for manufacturing a display panel according to the embodiment of the present application.

Referring to FIG. 8, in some embodiments, after the step S40 of removing the luminescent structure layer in the hole area, the method further includes forming a packaging layer 800 on the surface of the luminescent structure layer away from the substrate 100. The packaging layer 800 is stacked on the side of the second electrode layer 530 away from the substrate 100. In one example, the packaging layer 800 can be glass. In another example, the packaging layer 800 may include an organic layer, an inorganic layer, or a combination thereof. The organic layer may include more than one of polyolefin, polyvinyl chloride, polystyrene, polyimide (PI), polyethylene terephthalate (PET), epoxy resin, phenolic resin, etc. The inorganic layer can include more than one of silicon oxides, silicon nitrides, and silicon based nitrogen oxides. Optionally, the packaging layer 800 is an inorganic layer or a composite layer of inorganic and organic layers.

The packaging layer 800 can further cover the transition area TA and hole area HA to enhance the packaging effect. The packaging layer 800 can further fill the concave portion of the widened partition ring SR, forming a chimeric connection with the partition ring SR, thereby improving packaging stability.

In some embodiments, the portion of the packaging layer 800 at least located in the hole area HA includes a first sub packaging layer 810, a light modulation layer 820, and a second sub packaging layer 830 that are sequentially stacked. The light modulation layer 820 is configured to improve the light transmittance of the packaging layer 800. The first sub packaging layer 810, light modulation layer 820, and second sub packaging layer 830 can use a material known in the art. As an example, the first and second sub packaging layers 810 and 830 are selected from silicon nitride or silicon oxide, and the material of the first and second sub packaging layers 810 and 830 are different. The light modulation layer 820 can be selected from nitrogen oxides of silicon or a combination of silicon nitride and silicon oxide.

Figure 9:
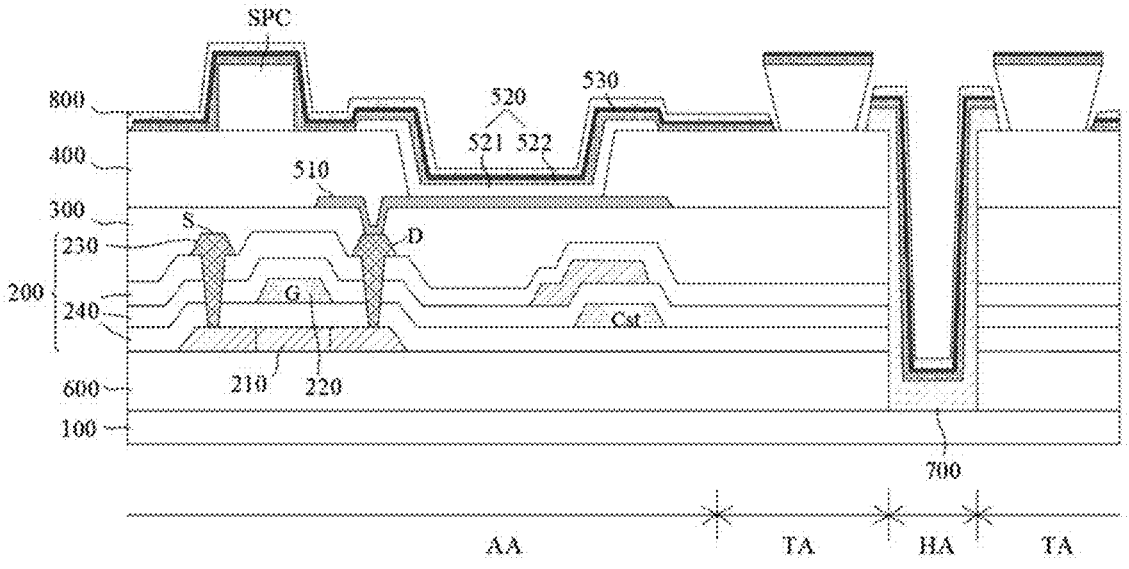
FIG. 9 is a step diagram of forming a packaging layer in the method for manufacturing a display panel according to another embodiment of the present application.
Figure 10:
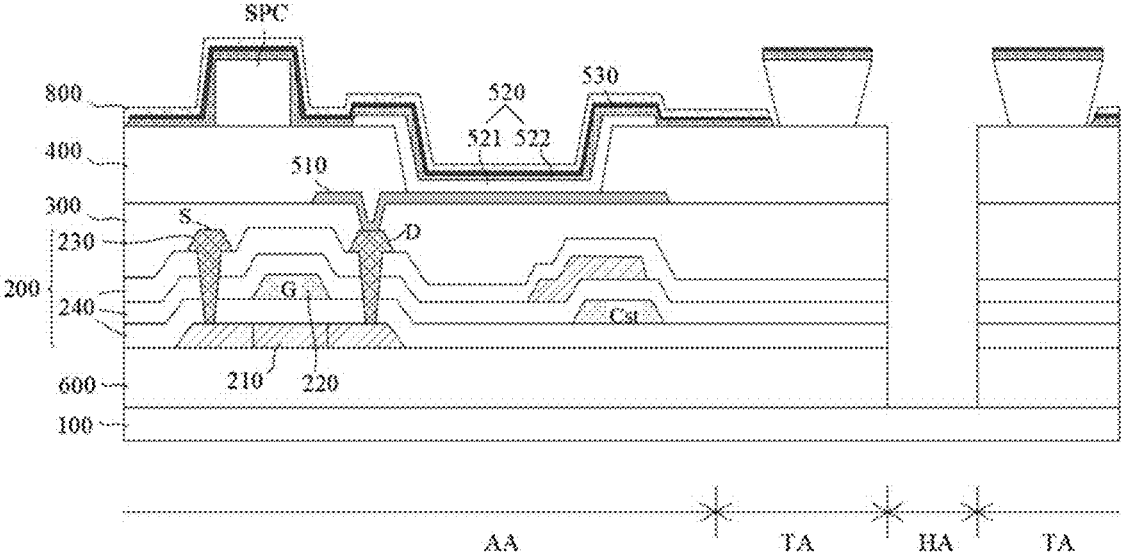
FIG. 10 is a step diagram of removing the film layer in the hole area in the method for manufacturing a display panel according to the embodiment of the present application.

Referring to FIGS. 9 and 10, in some embodiments, before the step S40 of removing the luminescent structure layer in the hole area, it further includes: forming a thin film packaging layer 800 on the surface of the luminescent structure layer away from the substrate 100, and the portion of the thin film packaging layer 800 located in the transition area TA is partitioned by a partition ring SR. Afterwards, in the step S40, the portion of the packaging layer 800 located in the hole area HA can be synchronously removed, improving transmittance while simplifying the process. The film packaging layer 800 can use a film packaging material known in the art. As an example, the thin film packaging layer 800 can be an inorganic layer or a composite layer of an inorganic layer and an organic layer. The inorganic layer can contain more than one of silicon oxides, silicon nitrides, and silicon based nitrogen oxides. The organic layer may include more than one of polyolefin, polyvinyl chloride, polystyrene, polyimide (PI), polyethylene terephthalate (PET), epoxy resin, phenolic resin, etc.

The embodiment of the present application further provides a display panel. The display panel is obtained according to the manufacturing method of the embodiment of the present application, thus achieving a high screen-to-body ratio. In addition, the partition ring SR located in the transition area TA can serve as a support for the cover plate, improving the overall strength of the display panel, and at the same time avoiding poor display caused by larger deformation of the cover plate in the hole area HA.

The embodiment of the present application further provides a display device, which includes a display panel according to the embodiment of the present application. The display device of the embodiment of the present application can achieve a high screen-to-body ratio due to the use of the display panel according to the embodiment of the present application. Furthermore, the display device can further have good display effects.

Examples of display devices can be mobile phones, tablets, smart learning machines, camcordable wearable products, etc.

According to the embodiments described in the present application, these embodiments do not fully describe all details, nor do they limit the present application to only the specific embodiments described. Obviously, based on the above description, there are many modifications and changes that can be made. This specification selects and specifically describes these embodiments in order to better explain the principles and practical applications of the present application, so that the skilled person in the art can make good use of the present application and modifications based on the present application. The present application is only limited by the claims and all their scope and equivalents.

What is claimed is:

1. A method for manufacturing a display panel, the display panel comprising a display area, a hole area, and a transition area located between the display area and the hole area, the method comprising steps of:

providing a semi-finished product of the display panel, the semi-finished product comprising a substrate and a partition ring disposed on a side of the substrate and located in the transition area, the partition ring being disposed around the hole area;

forming a desorption layer on a surface of the substrate and in the hole area, the desorption layer being made of a material with a sublimation temperature ≤200° C.;

forming a luminescent structure layer in the display area and the transition area on the side of the substrate, and forming a luminescent structure layer on a surface of the desorption layer on the side away from the substrate and in the hole area, a portion of the luminescent structure layer located in the transition area being partitioned by the partition ring; and sublimating the material of the desorption layer to remove a portion of the luminescent structural layer located in the hole area;

wherein after the step of sublimating the material of the desorption layer, the method further comprises the step of: forming a packaging layer on a surface of the luminescent structural layer away from the substrate.

2. The method according to claim 1, wherein the sublimation temperature of the material of the desorption layer is between 40° C. and 200° C.

3. The method according to claim 2, wherein the sublimation temperature of the material of the desorption layer is between 45° C. and 100° C.

4. The method according to claim 1, wherein the material of the desorption layer is selected from one or more of iodine monomer, naphthalene, arsenic trioxide, phosphorus pentachloride, acrylamide, aluminum trichloride, and ferric chloride.

5. The method according to claim 1, wherein the step of providing the semi-finished product of the display panel comprises steps of:

forming a pixel circuit layer, a flattening layer, a first electrode layer and a pixel defining layer sequentially on the surface of the substrate, and forming a blind hole extending towards the substrate from a surface of the pixel defining layer away from the substrate in the hole area; and forming the partition ring located in the transition area and a spacer located in the display area on the surface of the pixel defining layer away from the substrate.

6. The method according to claim 5, wherein the step of forming the desorption layer on the surface of the substrate and in the hole area comprises steps of:

blocking the display area and the transition area with a mask; and evaporating the material of the desorption layer onto the surface of the substrate located in the hole area to form the desorption layer.

7. The method according to claim 5, wherein a surface of the partition ring away from the substrate is coplanar with a surface of the spacer away from the substrate.

8. The method according to claim 1, wherein a cross-section of the partition ring in a stacking direction of film layers of the display panel decreases in a gradient from an edge away from the substrate to an edge close to the substrate.

9. The method according to claim 8, wherein the cross-section of the partition ring is inverted trapezoidal or T-shaped.

10. The method according to claim 1, wherein in the direction from the hole area to the display area, multiple partition rings are disposed at intervals in the transition area.

11. The method according to claim 1, wherein a portion of the packaging layer located in the hole area at least comprises a first sub packaging layer, a light modulation layer, and a second sub packaging layer that are sequentially stacked, and the light modulation layer being configured to improve a light transmittance of the packaging layer.

12. The method according to claim 1, wherein the step of sublimating the material of the desorption layer comprises steps of:

placing the semi-finished product of the display panel formed with the luminescent structure layer in a vacuum chamber, with a side of the luminescent structure layer of the semi-finished product of the display panel facing downwards; and heating to sublimate the material of the desorption layer, and discharging the sublimated material from the chamber along with vacuum pumping, to have the luminescent structural layer falling off.

13. A method for manufacturing a display panel, the display panel comprising a display area, a hole area, and a transition area located between the display area and the hole area, the method comprising steps of:

providing a semi-finished product of the display panel, the semi-finished product comprising a substrate and a partition ring disposed on a side of the substrate and located in the transition area, the partition ring being disposed around the hole area;

forming a desorption layer on a surface of the substrate and in the hole area, the desorption layer being made of a material with a sublimation temperature ≤200° C.;

forming a luminescent structure layer in the display area and the transition area on the side of the substrate, and forming a luminescent structure layer on a surface of the desorption layer on the side away from the substrate and in the hole area, a portion of the luminescent structure layer located in the transition area being partitioned by the partition ring; and sublimating the material of the desorption layer to remove a portion of the luminescent structural layer located in the hole area;

wherein the step of providing the semi-finished product of the display panel comprises steps of:

forming a pixel circuit layer, a flattening layer, a first electrode layer and a pixel defining layer sequentially on the surface of the substrate, and forming a blind hole extending towards the substrate from a surface of the pixel defining layer away from the substrate in the hole area; and forming the partition ring located in the transition area and a spacer located in the display area on the surface of the pixel defining layer away from the substrate;

wherein the step of forming the desorption layer on the surface of the substrate and in the hole area comprises steps of:

blocking the display area and the transition area with a mask; and evaporating the material of the desorption layer onto the surface of the substrate located in the hole area to form the desorption layer.

14. The method according to claim 13, wherein the material of the desorption layer is selected from one or more of iodine monomer, naphthalene, arsenic trioxide, phosphorus pentachloride, acrylamide, aluminum trichloride, and ferric chloride.

15. The method according to claim 13, wherein a cross-section of the partition ring in a stacking direction of film layers of the display panel decreases in a gradient from an edge away from the substrate to an edge close to the substrate.

16. The method according to claim 15, wherein the cross-section of the partition ring is inverted trapezoidal or T-shaped.

17. The method according to claim 13, wherein in the direction from the hole area to the display area, multiple partition rings are disposed at intervals in the transition area.

18. The method according to claim 13, wherein a surface of the partition ring away from the substrate is coplanar with a surface of the spacer away from the substrate.

19. The method according to claim 13, wherein before the step of sublimating the material of the desorption layer, the method further comprises the step of: forming a thin film packaging layer on the surface of the luminescent structural layer away from the substrate, a portion of the thin film packaging layer located in the transition area being partitioned by the partition ring.

20. The method according to claim 13, wherein the step of sublimating the material of the desorption layer comprises steps of:

placing the semi-finished product of the display panel formed with the luminescent structure layer in a vacuum chamber, with a side of the luminescent structure layer of the semi-finished product of the display panel facing downwards; and heating to sublimate the material of the desorption layer, and discharging the sublimated material from the chamber along with vacuum pumping, to have the luminescent structural layer falling off.

* * * * *